United States Patent [19]

Bourbina et al.

[11] Patent Number: 5,361,128
[45] Date of Patent: Nov. 1, 1994

[54] METHOD FOR ANALYZING IRREGULAR SHAPED CHUNKED SILICON FOR CONTAMINATES

[75] Inventors: Michael Bourbina; Lydia L. Hwang, both of Midland; Joaquin E. Luna, Saginaw; Scott A. Wheelock, Freeland, all of Mich.

[73] Assignee: Hemlock Semiconductor Corporation, Hemlock, Mich.

[21] Appl. No.: 942,907

[22] Filed: Sep. 10, 1992

[51] Int. Cl.$^5$ ............................................. G01N 1/00
[52] U.S. Cl. ....................................... 356/36; 356/311
[58] Field of Search ..................................... 356/36, 311

[56] References Cited

U.S. PATENT DOCUMENTS 4,912,528  3/1990  Hwang et al. .......................... 356/36

FOREIGN PATENT DOCUMENTS 1081827  9/1967  United Kingdom .

OTHER PUBLICATIONS

Kramer; Float-Zoning of Semiconductor Silicon: A Perspective, Solid State Technology, Jan. 1983, pp. 137–142.

Tajima; Jpn. Ann. Rev. Electron Comput. & Telecommun. Semicond. Technol. pp. 1–12 (1982); Quantitative Impurity Analysis in Si by The Photoluminescence Technique.

*Primary Examiner*—Davis L. Willis
*Assistant Examiner*—LaCharles P. Keesee, II
*Attorney, Agent, or Firm*—William F. Boley

[57] ABSTRACT

The present invention is a method for analyzing irregular-shaped chunked silicon for low-level contaminates. The method comprises selecting a zonable-chunk of silicon and float-zoning the chunk of silicon to effect a distribution of surface contaminates into the bulk of a monocrystal of silicon. The float-zoned monocrystalline silicon is then processed into a wafer suitable for analysis for low-level contaminates.

6 Claims, No Drawings

METHOD FOR ANALYZING IRREGULAR SHAPED CHUNKED SILICON FOR CONTAMINATES

BACKGROUND OF INVENTION

The present invention is a method for analyzing irregular-shaped chunked silicon for low-level surface and bulk contaminates. The method comprises selecting a zonable chunk of silicon and float-zoning the chunk of silicon to effect a distribution of surface contaminates into the bulk of a monocrystal of silicon. The float-zoned monocrystal of silicon is then processed into a wafer suitable for analysis for low-level contaminates.

Electronic components such as rectifiers, transistors, photo transistors, computer chips, and the like require extremely high purity monocrystalline silicon. In commercial processes this monocrystalline silicon is prepared by first forming polycrystalline silicon ingots by chemical vapor deposition of silanes onto a heated silicon element. These polycrystalline silicon ingots are then converted into monocrystalline silicon by float-zoning or by pulling a monocrystal from a melt, as exemplified by the Czochralski method. The float-zone method is more expensive and is limited by the size of polycrystalline silicon ingot that can be effectively made and float-zoned. Therefore, the Czochralski type process is a commonly practiced commercial process.

In order to be used in the Czochralski type process, the polycrystalline silicon ingots must be broken into chunks of suitable size to be efficiently added to the required melt. The present invention recognizes that during the process of breaking the polycrystalline silicon ingots into chunks and sizing, considerable surface contamination of the silicon can occur. Therefore, to accurately assess the contaminates associated with silicon added to the melt it is necessary to measure both this surface contamination and the bulk contamination of the silicon chunks.

The current most sensitive methods for analyzing silicon for low level of contaminates such as phosphorous and boron require a monocrystalline wafer of silicon. Prior to the present invention this monocrystalline silicon wafer has been prepared by float-zoning of a polycrystalline silicon ingot, as formed or after cutting to a suitable size. The use of such a sample for analyzing for contaminates does not account for contamination imparted to the silicon during the breaking and sizing process. Furthermore, the process of cutting a monocrystalline silicon element into a monocrystalline silicon wafer imparts significant surface contamination to the wafer which must be removed before determining contaminate levels associated with the monocrystalline silicon wafer. Thus, surface contamination cannot be determined.

Therefore, an objective of the present invention is to provide a monocrystalline silicon wafer suitable for analysis for total low-level contaminates such as phosphorous and boron associated with silicon chunks. The inventors have discovered that this objective can be achieved by using a modified float-zoning procedure to float-zone a zonable-chunk of silicon. The float-zoning process effects incorporation of the surface contaminates associated with the silicon chunk into the bulk of the silicon. Therefore during low-level contaminates analysis, the surface contaminates are retained with the sample. By this process the total contaminates, both surface and bulk, associated with silicon chunks suitable for use in a Czochralski type process can be assessed.

Float zoning of silicon rods, as exemplified by British Patent 1,081,827, published Sep. 6, 1967, is well known in the art. Kramer, Solid State Technology, January 1983, page 137, states the commonly assumed dogma of those skilled in the art that the polycrystalline silicon used in float-zoning must have geometrical dimensions with tight tolerances, and a very smooth surface. Therefore, unexpectedly the present inventors have discovered that irregular shaped silicon chunks, as described herein, can be float-zoned to provide monocrystalline silicon suitable for contaminates analysis.

Hwang et al., U.S. Pat. No. 4,912,528, issued Mar. 27, 1990, teaches a process where a silicon rod is float-zoned to provide a sample appropriate for trace element analysis.

SUMMARY OF INVENTION

The present invention is a method for analyzing irregular-shaped chunked silicon for low-level contaminates. The method comprises selecting a zonable-chunk of silicon and float-zoning the chunk of silicon to effect a distribution of surface contaminates into the bulk of a monocrystal of silicon. The float-zoned monocrystalline silicon is then processed into a wafer suitable for analysis for low-level contaminates.

DESCRIPTION OF INVENTION

The present invention is a method for analyzing irregular-shaped chunked silicon for contaminates. The method comprises:
(A) selecting a zonable-chunk of silicon,
(B) float-zoning the zonable-chunk of silicon to effect distribution of surface contamination of the zonable-chunk of silicon into a monocrystal of silicon,
(C) preparing a monocrystalline silicon wafer from the monocrystal of silicon, and
(D) determining concentrations of contaminates present in the monocrystalline silicon wafer.

For purposes of the present method, a "zonable-chunk" of silicon is an irregular-shaped chunk of silicon having length and diameter characteristics which allow the chunk to be held in the chuck of a float-zoning apparatus and having a maximum diameter smaller than that of the induction coil employed in the float-zoning apparatus. Those skilled in the art will recognize that the specific size requirements for the zonable chunk of silicon will be dependent upon the particular float-zoning apparatus employed. By way of example, when the float-zone apparatus is a Model VZA-3 Gas Siemens Zoner produced by Siemens Energy and Automation, Inc., East Brunswick, N.J., employing a 23 mm internal diameter induction coil, silicon chunks with the following dimensions are considered as a zonable-chunk: a diameter within a range of about 4 mm to 22 mm and a length within a range of about 5 cm to 20 cm.

Any irregular-shaped silicon chunk having the appropriate physical dimensions can be analyzed for contaminates by the present method. A preferred zonable-chunk of silicon is prepared by the breaking of semiconductor grade silicon ingots prepared by a chemical vapor deposition process.

The zonable-chunk of silicon is float-zoned into monocrystalline silicon. The float-zone process can be any one of many processes described in the art and is not limited to those described herein. The float-zone process can be, for example, a process where an end of the zonable-chunk of silicon is gripped in a chuck and held vertically in a vacuum chamber or in a chamber filled with a protective inert gas such as argon. The opposite end of the zonable-chunk of silicon is heated by an induction heating coil, so that a molten zone is formed. The molten zone is contacted with a seed crystal of monocrystalline silicon. The seed crystal may be a tapered rod portion grown in monocrystalline form by previous treatment. Float-zoning of the zonable-chunk of silicon contacted with the seed crystal is effected by relative movement between the induction coil and the zonable-chunk of silicon such that the molten zone is passed along the length of the zonable-chunk of silicon. Such a process is described, for example, by British Patent No. 1,081,827, published Sep. 6, 1967, and incorporated by reference herein.

In a preferred process, the zonable-chunk of silicon is pre-passed through the induction coil to smooth surface irregularities of the zonable-chunk of silicon. One or more pre-passes can be employed to obtain a relatively smooth zonable-chunk of silicon. The pre-pass can be accomplished by passing the zonable-chunk of silicon through a fixed induction coil or by passing a moveable induction coil along the length of the zonable-chunk of silicon. By "pre-pass," it is meant that the zonable-chunk is heated by the induction coil sufficient to cause surface melting of the zonable-chunk without effecting the formation of melt through the entirety. The pre-pass can be made as either a manual or an automatic process. However, the pre-pass is preferably performed as a manual operation, with continuous visual observation of the zonable-chunk of silicon being zoned.

A wafer of monocrystalline silicon is prepared from the monocrystalline silicon prepared by the float-zoning of the zonable-chunk of silicon. Typically the wafer of monocrystalline silicon is a 1.0 mm to 2.0 mm thick slice through the shorter axis of the monocrystalline silicon, the wafer typically being circular or oval in shape. However for the purpose of this invention, the term "wafer" can encompass any configuration of a sample separated from the monocrystalline silicon prepared by the float-zone process. The configuration of the wafer will be dependent upon the particular analytic method to be performed. The wafer can be formed from the monocrystalline silicon by standard procedures, for example, cutting or coring using a diamond tipped saw or coring apparatus.

Silicon readily picks up contaminates such as aluminum, boron, carbon, iron, and phosphorous during preparation of the monocrystalline silicon wafer. Therefore, it is preferred that the monocrystalline silicon wafers be cleaned to remove surface contaminates and prepare the surface for analysis. The monocrystalline silicon wafers can be cleaned by standard methods for cleaning silicon, for example, solvent wash, acid etching, and water rinsing either alone or in any combination. A preferred method for cleaning the silicon wafer is to etch with a mixture of hydrofluoric acid (HF), nitric acid ($HNO_3$), and acetic acid ($CH_3COOH$) followed by a distilled water rinse and solvent rinse.

The concentration of contaminates present in the monocrystalline silicon wafer is determined. The most sensitive analytical method for determining concentration of contaminates in the monocrystalline silicon will depend upon the particular contaminate of interest. Typical contaminates of concern in monocrystalline silicon intended for semi-conductor type applications are, for example, aluminum, boron, phosphorous, iron, and carbon. The concentration of other contaminates, such as transition metals, may be determined as well. Measurements of low-levels of arsenic, aluminum, boron, and phosphorous can be made, for example, by means of photoluminescent analysis. Standard procedures for photoluminescent analysis may be used, for example those procedures described by Tajima, Jap. Ann. Rev. Electron. Comput. and Telecom. Semicond. Tech., p. 1–12, 1982. Carbon can be measured, for example, by Fourier Transform infrared spectroscopy. Iron can be measured by atomic absorption spectroscopy of an extract of the wafer as described in Hwang et al., U.S. Pat. No. 4,912,528, issued Mar. 27, 1990.

The following examples are provided to illustrate the claimed method. These examples are not intended to limit the scope of the present claims.

EXAMPLE 1

The reproducibility of a method using float-zoning of zonable-chunks of silicon to provide monocrystalline silicon samples suitable for processing to determine contaminate levels was evaluated.

Float-zoning of the zonable-chunks of silicon was conducted in 5 kW R. F. generator, Gas Siemens Zoner (Model VZA-3, Siemens Energy and Automation, Inc., East Brunswick, N.J.). The zoning apparatus was equipped with a three point pressure chuck which allowed for centering of the irregular shaped zonable-chunks of silicon in the zoning apparatus.

The zonable-chunks of silicon were all from a single ingot of polycrystalline silicon prepared by chemical vapor deposition of trichlorosilane in the presence of hydrogen gas. The silicon ingot was broken into chunks. Zonable-chunks of silicon were selected to have a weight greater than 5.5 g, a diameter within a range of about 6 mm to 22 mm, and a length within a range of about 5 cm to 9 cm.

One or more float-zoning pre-passes were conducted on each zonable-chunk of silicon to round edges and improved the uniformity of each zonable-chunk of silicon. The pre-passes were conducted manually taking care to only effect surface melting of the zonable-chunk of silicon. After completion of the pre-passes the zonable-chunks of silicon were float-zoned by standard automated processes to provide monocrystalline silicon.

Wafers of the monocrystalline silicon were prepared for contaminates analysis by slicing the monocrystalline silicon with a diamond-tipped saw. Prior to analysis, the wafers were etched in a mixture of nitric acid, hydrofluoric acid, and glacial acetic acid at volume ratios of 5.7:1.8:2.5, respectively, for about 10 minutes. The etched wafers were rinsed in distilled water and dried. The etched wafers were analyzed for their concentration of boron and phosphorous by photoluminescence using a process similar to that described by Tajima, Jap. Ann. Rev. Electron. Comput. and Telecom. Semicond. Tech., p. 1–12, 1982.

Eight zonable-chunks were tested by the described method. The mean value for boron was determined to be 0.039 ppba with a standard deviation of ±0.011 ppba and the mean value for phosphorus was determined to be 0.186 ppba with a standard deviation of ±0.024 ppba.

EXAMPLE 2

The variability of contamination imparted to chunked silicon by the breaking process was analyzed by the method of float-zoning of zonable-chunks of silicon to provide monocrystalline silicon samples suitable for processing to determine contaminate levels. For this example silicon ingots prepared as described in Example 1 were broken into chunks. A zonable-chunk as described in Example 1 was selected from the broken chunks of each of seven different breaking procedures. These zonable chunks where float-zoned and wafer prepared and analyzed as described in Example 1. The mean value for boron was determined to be 0.034 ppba with a standard deviation of ±0.025 ppba and the mean value for phosphorus was determined to be 0.142 ppba with a standard deviation of ±0.038 ppba. For comparison purposes these values can be compared to core samples taken from similarly prepared polycrystalline silicon ingots, etched and rinsed as described, float-zoned by standard techniques, wafers prepared as described and analyzed as described. For 58 such cores analyzed, the mean boron level was determined to be 0.010 ppba with a standard deviation of ±0.012 ppba and the mean phosphorus level was determined to be 0.107 ppba with a standard deviation of ±0.034 ppba. This comparison demonstrates the significantly higher levels of boron and phosphorus determined to be present on silicon chunks in comparison to the boron and phosphorus levels typically found within the bulk of the polycrystalline silicon ingots.

We claim:

1. A method for analyzing irregular-shaped chunked silicon for contaminates, the method comprising:
   (A) selecting an irregular-shaped zonable-chunk of silicon,
   (B) float-zoning the irregular-shaped zonable-chunk of silicon to effect distribution of surface contamination of the irregular shaped zonable-chunk of silicon into a monocrystal of silicon,
   (C) preparing a monocrystalline silicon wafer from the monocrystal of silicon, and
   (D) determining concentrations of contaminates present in the monocrystalline silicon wafer.

2. A method according to claim 1, where the zonable-chunk of silicon is pre-passed through the float-zoning apparatus to smooth surface irregularities.

3. A method according to claim 1, where the zonable-chunk of silicon is an irregular-shaped chunk of silicon with a diameter within a range of about 4 mm to 22 mm and a length within a range of about 5 cm to 20 cm.

4. A method according to claim 1, where the zonable-chunk of silicon is prepared by the breaking of semiconductor grade silicon ingots prepared by a chemical vapor deposition process.

5. A method according to claim 1, where the determining of concentrations of contaminates present in the monocrystalline silicon wafer is by means of photoluminescent analysis.

6. A method for analyzing irregular-shaped chunked silicon for contaminates, the method comprising:
   (A) selecting an irregular-shaped zonable-chunk of silicon,
   (B) float-zoning the irregular-shaped zonable-chunk of silicon to effect distribution of surface contamination of the irregular shaped zonable-chunk of silicon into a monocrystal of silicon,
   (C) preparing a monocrystalline silicon wafer from the monocrystal of silicon, and
   (D) determining concentrations of boron contaminates and phosphorous contaminates present in the monocrystalline silicon wafer by means of photoluminescent analysis.

* * * * *